United States Patent
Jin et al.

(10) Patent No.: US 8,987,783 B2
(45) Date of Patent: Mar. 24, 2015

(54) SEMICONDUCTOR HETEROSTRUCTURE AND TRANSISTOR OF HEMT TYPE, IN PARTICULAR FOR LOW-FREQUENCY LOW-NOISE CRYOGENIC APPLICATIONS

(75) Inventors: Yong Jin, Fresnes (FR); Ulf Gennser, Paris (FR); Antonella Cavanna, Villiers sur Orge (FR)

(73) Assignee: Centre National de la Recherch Scientifique, Paris (FR)

( * ) Notice: Subject to any disclaimer, the term of this patent is extended or adjusted under 35 U.S.C. 154(b) by 0 days.

(21) Appl. No.: 13/878,948

(22) PCT Filed: Oct. 7, 2011

(86) PCT No.: PCT/IB2011/054432
§ 371 (c)(1),
(2), (4) Date: Jul. 10, 2013

(87) PCT Pub. No.: WO2012/049603
PCT Pub. Date: Apr. 19, 2012

(65) Prior Publication Data
US 2013/0277715 A1    Oct. 24, 2013

(30) Foreign Application Priority Data
Oct. 11, 2010 (FR) ...................................... 10 04012

(51) Int. Cl.
*H01L 31/072* (2012.01)
*H01L 29/20* (2006.01)
*H01L 29/778* (2006.01)
(52) U.S. Cl.
CPC ............ *H01L 29/20* (2013.01); *H01L 29/7785* (2013.01); *H01L 29/778* (2013.01)
USPC .................................. 257/194; 257/E29.246

(58) Field of Classification Search
USPC .................. 257/194, 200, E29.246, E29.172, 257/E21.407; 438/167, 172
See application file for complete search history.

(56) References Cited

U.S. PATENT DOCUMENTS

| 5,404,032 | A | 4/1995 | Sawada et al. |
| 5,449,928 | A | 9/1995 | Matsugatani et al. |
| 6,100,542 | A | 8/2000 | Kohara et al. |
| 6,160,274 | A * | 12/2000 | Folkes .......................... 257/191 |
| 6,724,019 | B2 * | 4/2004 | Oda et al. ...................... 257/195 |

OTHER PUBLICATIONS

International Search Report and Written Opinion for Application No. PCT/IB2011/054432 dated Jan. 16, 2012.

(Continued)

*Primary Examiner* — Quoc Hoang
(74) *Attorney, Agent, or Firm* — Alston & Bird LLP

(57) ABSTRACT

A semiconductor heterostructure having: a substrate (SS); a buffer layer (h); a spacer layer (d, e, f); a barrier layer (b, c); and which may also include a cover layer (a) is provided. The barrier layer is doped (DS); and the barrier and spacer layers are made of one or more semiconductors having wider bandgaps than the one or more materials forming the buffer layer, the heterostructure being characterized in that: the barrier layer comprises a first barrier sublayer (c) in contact with the spacer layer, and a second barrier sublayer (b), distant from the spacer layer; and in that the second barrier sublayer has a wider bandgap than the first barrier sublayer. The invention also relates to a HEMT transistor produced using such a heterostructure and to the use of such a transistor at cryogenic temperatures.

19 Claims, 2 Drawing Sheets

(56) References Cited

OTHER PUBLICATIONS

Brown, J. J. et al., *InP-based HEMT's With $Al_xIn_{1-x}P$ Schottkey Barrier Layers Grown by Gas-Source MBE*, Proceedings of the International Conference on Indium Phosphide and Related Materials (Mar. 1994) 419-422.

Tanabe, M. et al., *The Impact of Using AlGaAs as a Carrier Supplying Layer in an InAlAs/InGaAs High Electron Mobility Transistor Structure on Thermal Stability*, Applied Physics Letters, vol. 70, No. 25 (Jun. 1997) 3386-3388.

Ayela, F. et al., *Noise Measurements on Silicon JFETs at Low Temperature Using a Very High Q Superconductor Resonator*, Rev. Sci. Instrum. 62 (11) (Nov. 1991) 2816-2821.

Gremion, E. et al., *Development of Ultra-Low Noise HEMTs for Cryoelectronics at ≤4.2 K*, J. Low Temp.Phys. 151 (2008) 971-978.

Lin, H. C. et al., *Enhancement-Mode GaAs Metal-Oxide-Semiconductor High-Electron-Mobility Transistors With Atomic Layer Deposited $Al_2O_3$ as Gate Dielectric*, Applied Physics Letters 91, 212101 (2007).

Mizuno, S. et al., *Large Gate Leakage Current in AlGaN/GaN High Electron Mobility Transistors*, Jpn. J. Apl. Phys., vol. 41 (2002) 5125-5126.

Nagayama, A. et al., *Suppression of Gate Leakage Current in n-AlGaAs Power HEMT's*, IEEE Transactions on Electron Devices, vol. 47, No. 3 (Mar. 2000).

Plana, R et al., *Noise in AlGaAs/InGaAs/GaAs Pseudomorphic HEMTs from 10 Hz to 18 GHz*, IEEE Transactions on Electron Devices, vol. 40, No. 5 (May 1993).

\* cited by examiner

SEMICONDUCTOR HETEROSTRUCTURE AND TRANSISTOR OF HEMT TYPE, IN PARTICULAR FOR LOW-FREQUENCY LOW-NOISE CRYOGENIC APPLICATIONS

FIELD

The invention relates to a high electron mobility field effect transistor (HEMT) intended particularly, but not exclusively, for use at cryogenic temperatures, at low noise, and at low frequency. The invention also relates to a heterostructure from which such a transistor can be made.

BACKGROUND

A junction field effect transistor (JFET) made of silicon (Si) is the preferred component for all applications that require high input impedance and low noise level in the low frequency range. Typically, its equivalent input noise level is about 1 nanovolt per hertz (1 nV/Hz) at 1 kilohertz (kHz). Nevertheless, JFETs cannot operate at cryogenic temperatures, below about 40 kelvins (K), and below about 100 K, a clear degradation is observed in their performance in terms of transconductance and noise level. In this context, reference may be made to the article by F. Ayela et al. "Noise measurements on silicon JFETs at low temperature using a very high Q superconducting resonator", Rev. Sci. Instrum. 62 (11), November 1991, pp. 2816-2821.

The coupling between a detector cooled to cryogenic temperature and its JFET acquisition electronics must therefore be made via a cable, which introduces additional noise and which presents capacitance that reduces acquisition speed.

JFETs and metal-semiconductor field effect transistors (MESFETs) made of GaAs constitute an alternative to silicon JFETs for cryogenic applications. The performance of such components is described in the article by R. K. Kirschman and J. A. Lipa "Further evaluation of GaAs FETs for cryogenic read-out". Their low frequency noise level is typically higher than that of Si JFETs.

HEMTs can operate equally well at room temperature and at low temperature. These devices present excellent performance in the microwave frequency range, but they present a relatively high noise level at frequencies of less than about 1 gigahertz (GHz). In this respect, reference may be made to:

R. Plana et al. "Noise in AlGaAs/InGaAs/GaAs pseudomorphic HEMTs from 10 Hz to 18 GHz", IEEE Transactions on Electron Devices, Vol. 40, No. 5, May 1993; and E. Grémion et al. "Development of ultra-low noise HEMTs for cryoelectronics at ≤4.2 K", J. Low Temp. Phys. (2008) 151, pp. 971-978.

In addition, their gate leakage current is much greater than that of JFETs. Several alternative solutions have been proposed for reducing the gate current of HEMTs, in this context, reference may be made to the following articles:

S. Mizuno et al. "Large gate leakage current in AlGaN/GaN high electron mobility transistors", Jpn. J. Apl. Phys. Vol. 41 (2002), pp. 5125-5126;

H. C. Lin et al., "Enhancement-mode GaAs metal-oxide-semiconductor high-electron-mobility transistors with atomic layer deposited $Al_2O_3$ as gate dielectric", Applied Physics Letters 91, 212101 (2007); and A. Nagayama et al. "Suppression of gate leakage current in n-AlGaAs power HEMTs", IEEE Transactions on Electron Devices, Vol. 47, No. 3, March 2000.

The use of those solutions is found to be complex and does not enable a noise level to be reached that is as low as that of silicon JEFTs.

SUMMARY

The invention seeks to overcome the above-mentioned drawbacks of the prior art, and more particularly to enable transistors to be made that present high impedance, low gate leakage current with low noise level at low frequency, and that are suitable for operating at cryogenic temperatures.

In a first aspect, the invention provides a heterostructure that can be used as a base element for making such a transistor.

A semiconductor heterostructure of the invention comprises:
 a substrate;
 a buffer layer deposited on or over said substrate;
 a spacing layer deposited on or over said buffer layer; and
 a barrier layer deposited on said spacing layer;
 in which heterostructure:
 doping is provided in the barrier layer or at the interface between the spacing layer and the barrier layer; and
 said barrier and spacing layers are made of one or more semiconductor materials presenting a forbidden band wider than that of the materials constituting said buffer layer;
 the heterostructure being characterized in that:
 said barrier layer comprises a first barrier sublayer in contact with said spacing layer and a second barrier sublayer spaced apart from said spacing layer; and in that
 said second barrier sublayer presents a forbidden band that is wider than the forbidden band of said first barrier sublayer.

In various embodiments of the invention:

Said barrier layer may be made of a semiconductor material containing aluminum, said second barrier sublayer presenting an aluminum content that is higher than that of said first barrier sublayer. In particular, the barrier layer may be made of $Al_xGa_{1-x}As$ with a stoichiometric coefficient x presenting: in said first barrier sublayer, a value lying in the range 0.18 to 0.33; and in said second barrier sublayer, a value lying in the range 0.35 to 0.5. Preferably, the stoichiometric coefficient x of said second barrier sublayer may present a value lying in the range 0.38 to 0.42.

Said first barrier sublayer may present a thickness lying in the range 3 nanometers (nm) to 10 nm, and said second barrier sublayer presents a thickness lying in the range 3 nm to 50 nm.

Said spacing layer may comprise a first spacing sublayer in contact with said barrier layer, a second spacing sublayer deposited on or over said first spacing sublayer, and a third spacing sublayer deposited on or over said second spacing sublayer; and said second spacing sublayer may present a forbidden band that is wider than the forbidden bands of said first and second spacing sublayers. More particularly, said spacing sublayer may be made of $Al_xGa_{1-x}As$, with the stoichiometric coefficient x presenting: in said first and third spacing sublayers, a value lying in the range 0.18 to 0.33; and in said second spacing sublayer, a value lying in the range 0.35 to 0.5. Preferably, the stoichiometric coefficient x of said second spacing sublayer may present a value lying in the range 0.38 to 0.42. In a particularly advantageous embodiment, said first barrier sublayer may present a thickness lying in the range 3 nm to 15 nm, said second barrier sublayer may present a thickness lying in the range 1 nm to 50 nm, and said third barrier sublayer may present a thickness lying in the range 3 nm to 10 nm.

The heterostructure of the invention may further include an epitaxial layer between said buffer and spacing layers, the epitaxial layer being made of a semiconductor material having a narrower forbidden band. In particular, said epitaxial layer may be made of $In_yGa_{1-y}As$, the stoichiometric coefficient y presenting a value lying in the range 0.10 to 0.30. Advantageously, said epitaxial layer may present a thickness lying in the range 1 nm to 20 nm.

The heterostructure may include a cap layer deposited on or over said barrier layer.

Said buffer layer and/or said cap layer and/or said substrate may be made of GaAs.

The doping may be of N type, and may be in the form of a doping plane made of Si and having concentration lying in the range $1\times10^{12}$ per square centimeter ($cm^{-2}$) to $5\times10^{13}$ $cm^{-2}$.

A second aspect of the invention is an HEMT type transistor made from a heterostructure as described above. Advantageously, such a transistor may have a gate contact of length lying in the range 1 micrometer (μm) to 100 μm, and a width lying in the range 100 μm to 10 millimeters (mm).

A third aspect of the invention is the use of such a transistor at a cryogenic temperature, i.e. a temperature less than or equal to 100 K, preferably less than or equal to 77 K (the boiling temperature of liquid nitrogen at 1 atmosphere), and in even more preferred manner less than or equal to 4.2 K (the boiling temperature of liquid helium).

BRIEF DESCRIPTION OF THE DRAWINGS

Other characteristics, details, and advantages of the invention appear on reading the following description made with reference to the accompanying drawings given by way of example and in which.

DETAILED DESCRIPTION

HEMT type transistors are based on a two-dimensional electron gas (2DEG) that is confined in a potential well formed in a heterostructure at the interface between two semiconductor materials presenting forbidden bands of different widths. The electrons of the gas are spaced apart from the donors from which they come by a layer of semiconductor material having a wide forbidden band, thus ensuring the electrons have high mobility. They are in a degenerate state, and their behavior is practically independent of temperature.

The most common HEMT transistors are of the AsGa/$Al_xGa_{1-x}As$ type, in which AsGa constitutes the semiconductor having the "narrow" forbidden band and $Al_xGa_{1-x}As$ is the semiconductor having the "wide" forbidden band. The higher the Al content, as expressed by the parameter "x", the wider the forbidden band of the $Al_xGa_{1-x}As$, thereby reducing the leakage current from the gate of the transistor; a reduction in noise level is also observed when the value of "x" increases. However an excessive concentration of Al gives rise to the appearance of DX centers that capture the electrons and that thus constitute a source of 1/f noise. DX centers begin to appear as soon as x exceeds a value of 0.2; the best compromise between the efficiency with which donor atoms (generally Si) are ionized, the efficiency of their transfer to the $Al_xGa_{1-x}As/AsGa$ interface, and their low temperature trapping is achieved for x≈0.33.

Other semiconductor materials may be used for making HEMTs. By way of example, mention may be made of the $GaN/Al_xGa_{1-x}N$ system in which, likewise Al serves to widen the forbidden band, but also has the collateral effect of generating DX centers.

Figure 1:
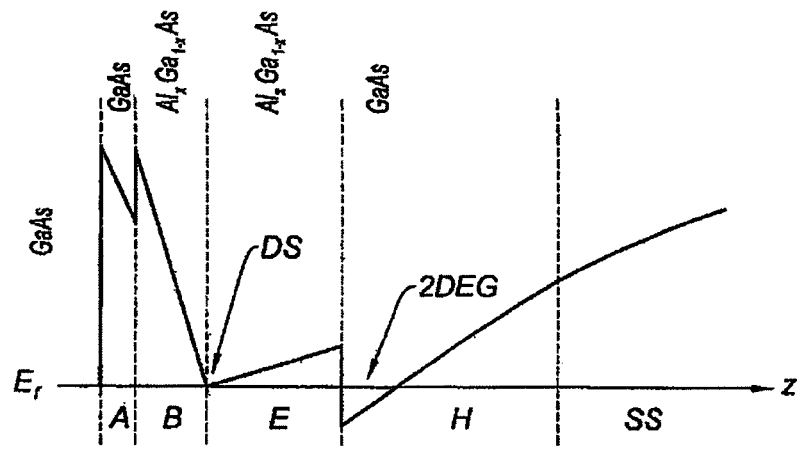
FIG. 1 shows the structure and the band structure of a heterostructure and an HEMT type transistor of the prior art.

FIG. 1 (which is not to scale) shows both the structure and the band structure (more exactly the appearance of the conduction band) of a prior art heterostructure suitable for making an HEMT. FIG. 1 is a graph in which a spatial coordinate is plotted along the abscissa axis (specifically the z axis that is perpendicular to the device, which is itself of planar structure), and in which conduction band energy is plotted up the ordinate axis; $E_f$ represents the Fermi energy.

Starting from the bottom, the heterostructure comprises:
a semi-insulating substrate SS, e.g. of intrinsic GaAs;
a "buffer" epitaxial layer H, also of intrinsic GaAs;
a "spacing" layer E, of intrinsic $Al_xGa_{1-x}As$ with x lying in the range 0.18 to 0.33;
a doping plane DS (or "δ doping") of N type, made of Si;
a "barrier" layer B, also made of intrinsic $Al_xGa_{1-x}As$ with x lying in the range 0.18 to 0.33; and
a covering or "cap" layer A of intrinsic or doped GaAs having the function of protecting the aluminum-containing underlying layers from oxidation.

The buffer layer presents thickness of micrometer order, the spacing and barrier layers present thickness of a few tens of nanometers, and the cap layer presents a thickness of a few nanometers. The electrons from the Si donor atoms migrate towards the interface between the buffer layer and the spacing layer where they form a two-dimensional gas given the reference 2DEG.

Figure 2:
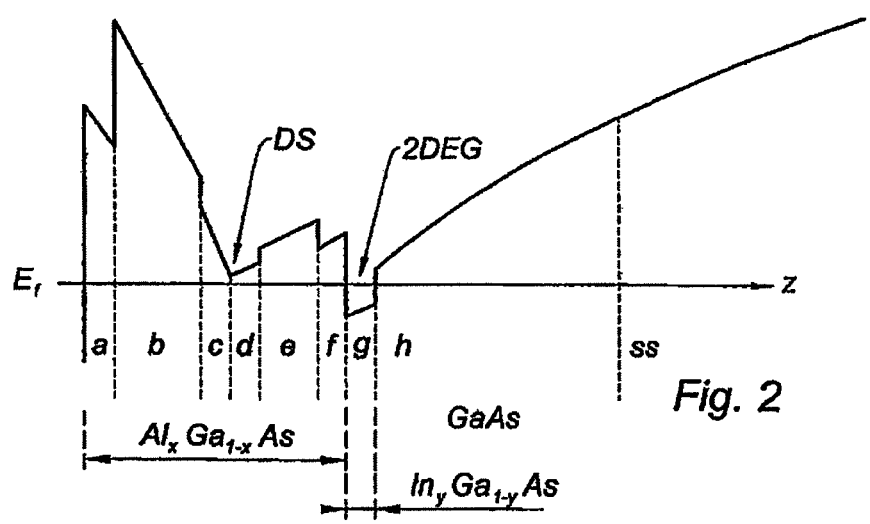
FIG. 2 shows the structure and the band structure of a heterostructure and an HEMT type transistor in an embodiment of the invention.

In the same manner, FIG. 2 (which is not to scale) shows the structure and the band structure of a heterostructure enabling an HEMT to be made in an embodiment of the invention.

From the bottom upwards, this heterostructure comprises:
a semi-insulating substrate SS, e.g. of intrinsic GaAs;
a "buffer" epitaxial layer h, also of intrinsic GaAs;
an epitaxial layer g of $In_yGa_{1-y}As$ with 0.10≤y≤0.30, of thickness lying in the range 1 nm to 20 nm;
a spacing layer made up of three layers of $Al_xGa_{1-x}As$:
a first sublayer f, of thickness lying in the range 3 nm to 15 nm, in which 0.18≤x≤0.33;
a second sublayer e, of thickness lying in the range 1 nm to 50 nm, in which 0.35≤x≤0.50; and
a third sublayer d, of thickness lying in the range 3 nm to 10 nm, in which 0.18≤x≤0.33;
a doping plane DS of N type, using Si at a concentration lying in the range $1\times10^{12}$ $cm^{-2}$ to $5\times10^{13}$ $cm^{-2}$;
a barrier layer formed by two sublayers of $Al_xGa_{1-x}As$:
a first sublayer c, of thickness lying in the range 3 nm to 10 nm, in which 0.18≤x≤0.33; and
a second sublayer b, of thickness lying in the range 3 nm to 50 nm, in which 0.35≤x≤0.50; and
a covering or "cap" layer of GaAs.

The second barrier sublayer b presents an Al content that is higher than that of the barrier layers in conventional devices. As a result, it has a wider forbidden band, thereby limiting the leakage current from the gate of the transistor. It is also separated from the donor atoms by the first barrier sublayer c, thereby avoiding electrons being trapped by the numerous DX centers within it.

Likewise, the second spacing sublayer e presents an Al content higher than the spacing layers of conventional devices. As a result, it has a wider forbidden band, thereby limiting the leakage current from the gate of the transistor. Simultaneously, it is separated from the donor atoms by the third spacing sublayer d and from the two-dimensional electron gas by the first spacing sublayer f, thereby avoiding electrons being trapped by the numerous DX centers within it.

The layer g, having a forbidden band narrower than that of GaAs, also contributes to confining the electrons.

The stoichiometric coefficient x preferably has a value lying in the range 0.38 to 0.42 in the sublayers b and e. The forbidden band of $Al_xGa_{1-x}As$ has a maximum width when $x \approx 0.4$.

Several variants of the invention can be envisaged. In particular, it is not essential for the spacing layer to present the composite structure shown in FIG. 2, and the layer g could be omitted. Furthermore, the principle of the invention may be applied to semiconductor materials other than the $Al_xGa_{1-x}As/GaAs$ system, such as for example $GaN/Al_xGa_{1-x}N$. The use of a doping plane (or "$\delta$ type doping) is not essential, but it makes it possible to obtain HEMT transistors with greater transconductance by reducing the distance between the gate and the two-dimensional carrier gas. Dopants other than silicon could be used; in principle, P doping is also possible, but that would lead to transistors presenting electronic performance that is not as good because of the smaller mobility of holes. Furthermore, the heterostructure may be more complex than that shown in FIG. 2, and it could include additional layers or sublayers.

The transistor of the invention is particularly adapted to cryogenic applications, at temperatures less than or equal to 100 K, and preferably less than or equal to 77 K (the boiling temperature of liquid nitrogen). However this is not an essential limitation, and the device can also find applications at higher temperatures.

Figure 3:
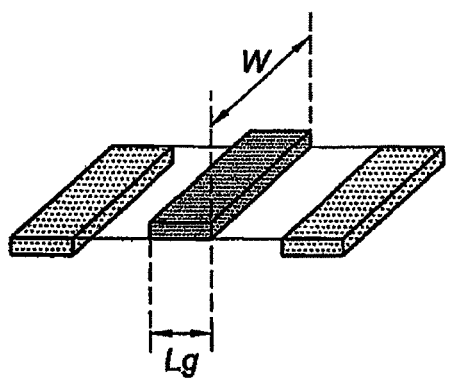
FIG. 3 shows the configuration of electrodes in an HEMT type transistor in an embodiment of the invention.

An HEMT may be made on the FIG. 2 heterostructure by depositing a source electrode S and a drain electrode D on the covering layer so as to form resistive contacts, and a gate electrode G directly on the barrier layer, so as to form a Schottky contact. This configuration is shown in FIG. 3. It has been found that the dimensions of the gate electrode, which is generally of rectangular shape, has a great influence on the noise level of the device; in particular, the use of an electrode of relatively large area makes it possible to minimize the effect of the statistical fluctuations that give rise to noise. The best results have been obtained by having a gate width W lying in the range 100 µm to 10 mm and a gate length Lg lying in the range 1 µm to 100 µm.

A device in a particular embodiment of the invention presents the following structure:

a substrate of semi-insulating GaAs;
a buffer layer of GaAs, with a thickness of 1 µm;
no g layer;
a homogeneous spacing layer of $Al_{0.33}Ga_{0.67}As$ having a thickness of 20 nm;
an Si doping plane at a concentration of $1.9 \times 10^{13}$ cm$^{-2}$;
a barrier layer made up of a first sublayer of $Al_{0.33}Ga_{0.67}As$ with a thickness of 5 nm and a second sublayer of $Al_{0.40}Ga_{0.60}As$, with a thickness of 10 nm;
a cap layer of GaAs with a thickness of 6 nm; and
Lg=8 µm, W=2 mm.

Its electronic characteristics at 4.2 K and with a drain-source voltage $V_{ds}$=0.1 volts (V), a gate-source voltage $V_{gs}$=−0.18 V, and a drain-source current $I_{ds}$=1 milliamps (mA) are as follows:

gate leakage current $I_{gs}$ less than 0.1 picoamps (pA);
power dissipated in the transistor: 100 microwatts (µW);
transconductance $g_m$: 50 millisiemens (mS);
outlet conductance $g_d$: 2.1 mS;
gate-source capacitance $C_{gs}$: 23 picofarads (pF);
gate-drain capacitance $C_{gd}$: 3.3 pF;
voltage gain: 10.7 with a load resistance of 301 ohms (Ω);
equivalent input noise level in volts: 0.9 nV/√Hz at 1 kHz;
frequency at which the 1/f noise level is equal to the level of white noise: 48 kHz;
current cutoff frequency $ft=g_m/2\pi C_{gs}$: 0.4 GHz; and
RC cutoff frequency with a source impedance $R_s$=10 kΩ, $f_c=1/(2\pi R_s C_{gs})$=0.69 MHz.

Figure 4A:
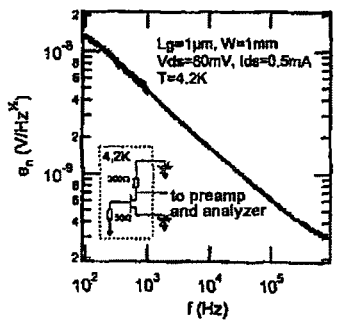
FIGS. 4A to 4D and 5 show the influence of the geometry of the gate on the equivalent input noise in an HEMT type transistor in an embodiment of the invention.
Figure 4B:
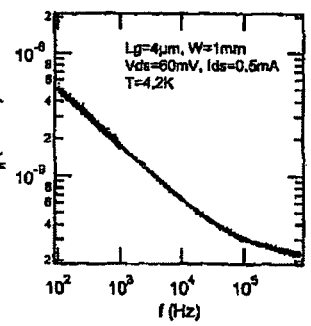
Figure 4C:
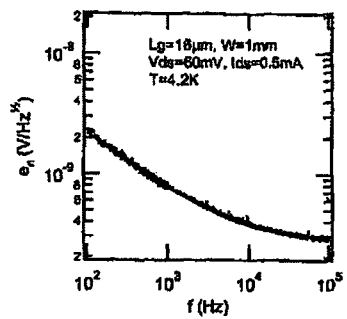
Figure 4D:
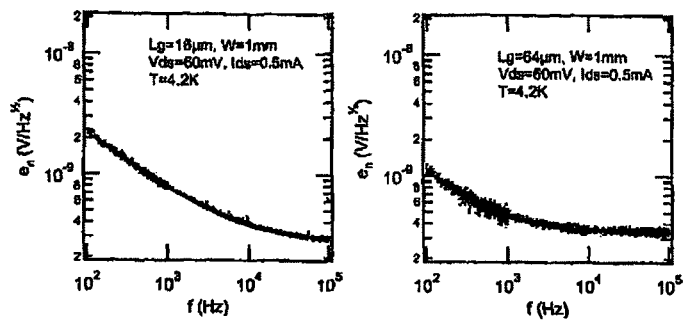

FIGS. 4A to 4D show the noise spectra (equivalent input noise voltage $e_n$ expressed as a function of frequency f) for four transistors presenting the above-described structure, but with gates of different lengths Lg: 1 µm for FIG. 4A, 4 µm for FIG. 4B, 16 µm for FIG. 4C, and 64 µm for FIG. 4D; the gate width W is equal to 1 mm in all four cases. The spectra correspond to the following working point: drain-source voltage $V_{ds}$=60 millivolts (mV); drain-source current $I_{ds}$=0.5 mA, at a temperature of 4.2 K with an input resistance of 50Ω and a load resistance of 300Ω. The gate leakage current remains less than 1 pA in all four cases.

In the figures, the points correspond to experimental results obtained by amplifying the output noise voltage with a very low noise preamplifier, and analyzing the dynamic spectrum with an analyzer and deducing therefrom the equivalent input voltage. The continuous curves correspond to interpolation on the basis of a model of white noise superposed on 1/f noise.

It can be seen that the noise at low frequency (less than 1 kHz) decreases with increasing gate area and drops to below 1 nV/Hz at 1 kHz for gate areas greater than 16 µm×1 mm.

Figure 5:
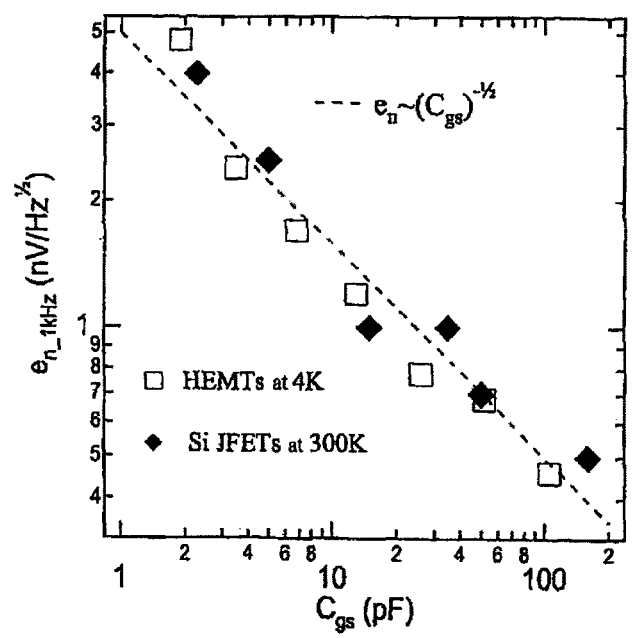

The gate capacitance $C_{gs}$ was measured by determining the cutoff frequency; it is practically independent of $V_{gs}$ and is equal to: 1.9 pF for Lg=1 µm; 6.8 pF for Lg=4 µm; 26 pF for Lg=16 µm; and 105 pF for Lg=64 µm. FIG. 5 is a log-log graph showing the relationships that exists between $e_{n-1kHz}$ (equivalent input noise level in volts at 1 kHz) and $C_{gs}$; the straight line corresponds to the proportionality:

$$e_{n-1kHz} \propto 1/\sqrt{C_{gs}}$$

The white squares correspond to devices of the invention; it can be seen that their noise performance is at least as good as the noise performance of a silicon JFET at 300 K (black lozenges corresponding from left to right to the following references from the supplier InterFET: NJ14AL; NJ26L; NJ132L; NJ450L; NJ903L; and NJ1800DL).

The invention claimed is:

1. A semiconductor heterostructure comprising:
a substrate;
a buffer layer deposited on or over said substrate;
a spacing layer deposited on or over said buffer layer; and
a barrier layer deposited on said spacing layer;
in which heterostructure:
doping is provided in the barrier layer or at the interface between the spacing layer and the barrier layer; and
said barrier and spacing layers are made of one or more semiconductor materials presenting a forbidden band wider than that of the materials constituting said buffer layer;
the heterostructure being characterized in that:
said barrier layer comprises a first barrier sublayer in contact with said spacing layer and a second barrier sublayer spaced apart from said spacing layer; and in that
said second barrier sublayer presents a forbidden band that is wider than the forbidden band of said first barrier sublayer, and wherein said barrier layer is made of a semiconductor material containing aluminum, said second barrier sublayer presenting an aluminum content that is higher than that of said first barrier sublayer.

2. A semiconductor heterostructure according to claim 1, wherein said barrier layer is made of $Al_xGa_{1-x}As$ and wherein the stoichiometric coefficient x presents:
in said first barrier sublayer, a value lying in the range 0.18 to 0.33; and
in said second barrier sublayer, a value lying in the range 0.35 to 0.5.

3. A semiconductor heterostructure according to claim 2, wherein the stoichiometric coefficient x of said second barrier sublayer presents a value lying in the range 0.38 to 0.42.

4. A semiconductor heterostructure according to claim 1, wherein said first barrier sublayer presents a thickness lying in the range 3 nm to 10 nm, and said second barrier sublayer presents a thickness lying in the range 3 nm to 50 nm.

5. A semiconductor heterostructure according to claim 1, wherein:
said spacing layer comprises a first spacing sublayer a second spacing sublayer deposited on or over said first spacing sublayer, and a third spacing sublayer deposited on or over said second spacing sublayer, said third spacing sublayer in contact with said barrier layer; and
said second spacing sublayer presents a forbidden band that is wider than the forbidden bands of said first and second spacing sublayers.

6. A semiconductor heterostructure according to claim 5, wherein said spacing sublayer is made of $Al_xGa_{1-x}As$ and wherein the stoichiometric coefficient x presents:
in said first and third spacing sublayers, a value lying in the range 0.18 to 0.33; and
in said second spacing sublayer, a value lying in the range 0.35 to 0.5.

7. A semiconductor heterostructure according to claim 6, wherein the stoichiometric coefficient x of said second spacing sublayer presents a value lying in the range 0.38 to 0.42.

8. A semiconductor heterostructure according to claim 5, wherein said first barrier sublayer presents a thickness lying in the range 3 nm to 15 nm, said second barrier sublayer presents a thickness lying in the range 1 nm to 50 nm, and said third barrier sublayer presents a thickness lying in the range 3 nm to 10 nm.

9. A semiconductor heterostructure according to claim 1 and further including an epitaxial layer between said buffer and spacing layers, the epitaxial layer being made of a semiconductor material having a narrower forbidden band.

10. A semiconductor heterostructure according to claim 9, wherein said epitaxial layer is made of $In_yGa_{1-y}As$, the stoichiometric coefficient y presenting a value lying in the range 0.10 to 0.30.

11. A semiconductor heterostructure according to claim 9, wherein said epitaxial layer presents a thickness lying in the range 1 nm to 20 nm.

12. A semiconductor heterostructure according to claim 1, wherein said buffer layer is made of GaAs.

13. A semiconductor heterostructure according to claim 1, also including a cap layer deposited on or over said barrier layer.

14. A semiconductor heterostructure according to claim 1, wherein said substrate is made of GaAs.

15. A semiconductor heterostructure according to claim 1, wherein said doping is of N type.

16. A semiconductor heterostructure according to claim 15, wherein said doping is in the form of a doping plane and is made of Si at a concentration lying in the range $1 \times 10^{12}$ $cm^{-2}$ to $5 \times 10^{13}$ $cm^{-2}$.

17. A high electron mobility field effect transistor (HEMT) made from a heterostructure according to claim 1.

18. A transistor according to claim 17, having a gate contact presenting a length (Lg) lying in the range 1 μm to 100 μm and a width (W) lying in the range 100 μm to 10 mm.

19. A method of using the transistor according to claim 17 at a temperature less than or equal to 100 K, preferably less than or equal to 77 K, and in even more preferred manner less than or equal to 4.2 K.

* * * * *

UNITED STATES PATENT AND TRADEMARK OFFICE
CERTIFICATE OF CORRECTION

| | | |
|---|---|---|
| PATENT NO. | : 8,987,783 B2 | Page 1 of 1 |
| APPLICATION NO. | : 13/878948 | |
| DATED | : March 24, 2015 | |
| INVENTOR(S) | : Jin et al. | |

It is certified that error appears in the above-identified patent and that said Letters Patent is hereby corrected as shown below:

On the Title Page,
Item (73) Assignee: "Centre National de la Recherch Scientifique" should read
--Centre National de la Recherche Scientifique--.

Signed and Sealed this
Thirteenth Day of October, 2015

Michelle K. Lee
*Director of the United States Patent and Trademark Office*